US009287627B2

(12) United States Patent
Jarvis et al.

(10) Patent No.: US 9,287,627 B2
(45) Date of Patent: Mar. 15, 2016

(54) CUSTOMIZABLE ANTENNA FEED STRUCTURE

(75) Inventors: Daniel W. Jarvis, Sunnyvale, CA (US); Mattia Pascolini, San Mateo, CA (US); Joshua G. Nickel, San Jose, CA (US)

(73) Assignee: Apple Inc., Cupertino, CA (US)

( * ) Notice: Subject to any disclaimer, the term of this patent is extended or adjusted under 35 U.S.C. 154(b) by 583 days.

(21) Appl. No.: 13/223,102

(22) Filed: Aug. 31, 2011

(65) Prior Publication Data

US 2013/0050046 A1 Feb. 28, 2013

(51) Int. Cl.

| | |
|---|---|
| ***H01Q 1/50*** | (2006.01) |
| ***G01R 31/28*** | (2006.01) |
| ***H01Q 9/04*** | (2006.01) |
| ***H01Q 1/24*** | (2006.01) |
| ***H01Q 9/14*** | (2006.01) |

(52) U.S. Cl.

CPC ............. *H01Q 9/0421* (2013.01); *H01Q 1/243* (2013.01); *H01Q 9/145* (2013.01); *Y10T 29/49004* (2015.01)

(58) Field of Classification Search

CPC ................................. H01Q 1/50; G01R 31/28

USPC ............................................ 343/852; 29/593

See application file for complete search history.

(56) References Cited

U.S. PATENT DOCUMENTS

| | | | |
|---|---|---|---|
| 4,074,419 | A | 2/1978 | Hannie et al. |
| 4,617,571 | A | 10/1986 | Choquer et al. |
| 5,045,971 | A | 9/1991 | Ono et al. |
| 5,128,829 | A | 7/1992 | Loew |

(Continued)

FOREIGN PATENT DOCUMENTS

| | | |
|---|---|---|
| CN | 1361970 | 7/2002 |
| CN | 2757458 | 2/2006 |

(Continued)

OTHER PUBLICATIONS

Ho et al., "Cost Effective Integrated Housing and Printed Circuit Module for Battery Pack," IP.com Prior Art Database, Apr. 29, 2004 (6 pages).

(Continued)

*Primary Examiner* — Dameon E Levi
*Assistant Examiner* — Andrea Lindgren Baltzel
(74) *Attorney, Agent, or Firm* — Treyz Law Group, P.C.; G. Victor Treyz; Zachary D. Hadd

(57) ABSTRACT

Custom antenna structures may be used to compensate for manufacturing variations in electronic device antennas. An antenna may have an antenna feed and conductive structures such as portions of a peripheral conductive electronic device housing member. The custom antenna structures compensate for manufacturing variations that could potentially lead to undesired variations in antenna performance. The custom antenna structures may make customized alterations to antenna feed structures or conductive paths within an antenna. An antenna may be formed from a conductive housing member that surrounds an electronic device. The custom antenna structures may be formed from a printed circuit board with a customizable trace. The customizable trace may have a contact pad portion on the printed circuit board. The customizable trace may be customized to connect the pad to a desired one of a plurality of contacts associated with the conductive housing member to form a customized antenna feed terminal.

12 Claims, 12 Drawing Sheets

(56) References Cited

U.S. PATENT DOCUMENTS

| | | | | |
|---|---|---|---|---|
| 5,180,644 | A | 1/1993 | Bresin et al. | |
| 5,245,745 | A | 9/1993 | Jensen et al. | |
| 5,468,947 | A | 11/1995 | Danielson et al. | |
| 5,568,358 | A | 10/1996 | Nelson et al. | |
| 5,737,183 | A | 4/1998 | Kobayashi et al. | |
| 5,784,256 | A | 7/1998 | Nakamura et al. | |
| 5,796,575 | A | 8/1998 | Podwalny et al. | |
| 6,014,113 | A | 1/2000 | Orchard et al. | |
| 6,038,328 | A | 3/2000 | Hsu | |
| 6,137,890 | A | 10/2000 | Markow | |
| 6,144,368 | A | 11/2000 | Ooka et al. | |
| 6,153,834 | A | 11/2000 | Cole et al. | |
| 6,408,171 | B1 | 6/2002 | Schuelke et al. | |
| 6,427,017 | B1 | 7/2002 | Toki | |
| 6,452,811 | B1 | 9/2002 | Tracey et al. | |
| 6,536,589 | B2 | 3/2003 | Chang | |
| 6,746,797 | B2 | 6/2004 | Benson et al. | |
| 6,757,157 | B2 | 6/2004 | Lammintaus et al. | |
| 6,781,824 | B2 | 8/2004 | Krieger et al. | |
| 6,812,898 | B2 | 11/2004 | Doub et al. | |
| 6,819,946 | B2 | 11/2004 | Hansson | |
| 6,838,810 | B1 | 1/2005 | Bovio et al. | |
| 6,847,522 | B2 | 1/2005 | Fan et al. | |
| 6,897,814 | B2 | 5/2005 | Iwai et al. | |
| 6,929,879 | B2 | 8/2005 | Yamazaki | |
| 7,132,987 | B1 | 11/2006 | Olsson et al. | |
| 7,149,557 | B2 | 12/2006 | Chadha | |
| 7,190,802 | B2 | 3/2007 | Rains et al. | |
| 7,236,357 | B2 | 6/2007 | Chen | |
| 7,297,439 | B2 | 11/2007 | Yamazaki et al. | |
| 7,336,243 | B2 | 2/2008 | Jo et al. | |
| 7,352,584 | B1 | 4/2008 | Sung | |
| 7,412,267 | B2 | 8/2008 | Eaton et al. | |
| 7,432,860 | B2 | 10/2008 | Huynh | |
| 7,515,115 | B2 | 4/2009 | Leisten et al. | |
| 7,515,431 | B1 | 4/2009 | Zadesky et al. | |
| 7,553,055 | B2 | 6/2009 | Liu | |
| 7,558,054 | B1 | 7/2009 | Prest et al. | |
| 7,558,057 | B1 | 7/2009 | Naksen et al. | |
| 7,558,396 | B2 | 7/2009 | Liu et al. | |
| 7,564,424 | B2 | 7/2009 | Umehara | |
| 7,583,987 | B2 | 9/2009 | Park | |
| 7,612,725 | B2 | 11/2009 | Hill et al. | |
| 7,620,175 | B2 | 11/2009 | Black et al. | |
| 7,663,607 | B2 | 2/2010 | Hotelling et al. | |
| 7,668,332 | B2 | 2/2010 | Williams et al. | |
| 7,671,804 | B2 | 3/2010 | Zhang et al. | |
| 7,688,574 | B2 | 3/2010 | Zadesky et al. | |
| 7,697,281 | B2 | 4/2010 | Dabov et al. | |
| 7,733,280 | B2 | 6/2010 | Cornwell | |
| 7,804,451 | B2 | 9/2010 | Glocker et al. | |
| 7,876,274 | B2 | 1/2011 | Hobson et al. | |
| 7,889,139 | B2 | 2/2011 | Hobson et al. | |
| 7,936,307 | B2 | 5/2011 | Pang et al. | |
| 8,102,321 | B2 | 1/2012 | Chiang et al. | |
| 8,169,373 | B2 | 5/2012 | Schlub et al. | |
| 8,270,914 | B2 | 9/2012 | Pascolini et al. | |
| 8,391,010 | B2 | 3/2013 | Rothkopf et al. | |
| 8,427,379 | B2 | 4/2013 | Rothkopf et al. | |
| 8,477,492 | B2 | 7/2013 | Rothkopf et al. | |
| 8,482,467 | B2 | 7/2013 | Jarvis et al. | |
| 8,493,071 | B1 * | 7/2013 | Mardi et al. | 324/537 |
| 8,515,113 | B2 | 8/2013 | Rothkopf et al. | |
| 8,634,204 | B2 | 1/2014 | Rothkopf et al. | |
| 2002/0102870 | A1 | 8/2002 | Burns et al. | |
| 2002/0107044 | A1 | 8/2002 | Kuwata et al. | |
| 2002/0114143 | A1 | 8/2002 | Morrison et al. | |
| 2003/0003945 | A1 | 1/2003 | Saiki et al. | |
| 2003/0081392 | A1 | 5/2003 | Cady et al. | |
| 2004/0084244 | A1 | 5/2004 | Zurek et al. | |
| 2004/0203518 | A1 | 10/2004 | Zheng et al. | |
| 2005/0014537 | A1 | 1/2005 | Gammon et al. | |
| 2005/0088778 | A1 | 4/2005 | Chen et al. | |
| 2005/0095745 | A1 | 5/2005 | Sapir | |
| 2006/0067070 | A1 | 3/2006 | Otsuki | |
| 2006/0119503 | A1 | 6/2006 | Allen et al. | |
| 2006/0157842 | A1 | 7/2006 | Goodwin | |
| 2006/0262500 | A1 | 11/2006 | Huang et al. | |
| 2007/0007661 | A1 * | 1/2007 | Burgess et al. | 257/778 |
| 2007/0058821 | A1 | 3/2007 | Welsh et al. | |
| 2007/0081303 | A1 | 4/2007 | Lam et al. | |
| 2007/0160228 | A1 | 7/2007 | Yang et al. | |
| 2008/0025547 | A1 | 1/2008 | Yun et al. | |
| 2008/0037765 | A1 | 2/2008 | Finney et al. | |
| 2008/0055164 | A1 | 3/2008 | Zhang | |
| 2008/0062660 | A1 | 3/2008 | Weber et al. | |
| 2008/0069384 | A1 | 3/2008 | Kim et al. | |
| 2008/0088511 | A1 | 4/2008 | Sorvala et al. | |
| 2008/0101026 | A1 | 5/2008 | All | |
| 2008/0165065 | A1 * | 7/2008 | Hill et al. | 343/702 |
| 2008/0165139 | A1 | 7/2008 | Hotelling et al. | |
| 2008/0165485 | A1 | 7/2008 | Zadesky et al. | |
| 2008/0266774 | A1 | 10/2008 | Tracey et al. | |
| 2008/0316116 | A1 | 12/2008 | Hobson et al. | |
| 2008/0316121 | A1 | 12/2008 | Hobson et al. | |
| 2008/0316135 | A1 | 12/2008 | Hilgers | |
| 2009/0015510 | A1 | 1/2009 | Nakata et al. | |
| 2009/0049773 | A1 | 2/2009 | Zadesky et al. | |
| 2009/0059485 | A1 | 3/2009 | Lynch et al. | |
| 2009/0067141 | A1 | 3/2009 | Dabov et al. | |
| 2009/0155681 | A1 | 6/2009 | Lin et al. | |
| 2009/0160712 | A1 | 6/2009 | Breiter et al. | |
| 2009/0179811 | A1 | 7/2009 | Chou | |
| 2009/0181570 | A1 | 7/2009 | Revelle, II | |
| 2009/0185045 | A1 | 7/2009 | Rosenbalt | |
| 2009/0201652 | A1 | 8/2009 | Chew et al. | |
| 2009/0245564 | A1 | 10/2009 | Mittleman et al. | |
| 2009/0256758 | A1 | 10/2009 | Schlub et al. | |
| 2009/0256759 | A1 | 10/2009 | Hill et al. | |
| 2009/0257189 | A1 | 10/2009 | Wang et al. | |
| 2009/0257613 | A1 | 10/2009 | Khamashta et al. | |
| 2009/0302804 | A1 | 12/2009 | Park et al. | |
| 2010/0007564 | A1 * | 1/2010 | Hill et al. | 343/702 |
| 2010/0008040 | A1 | 1/2010 | Weber et al. | |
| 2010/0060421 | A1 | 3/2010 | Chang et al. | |
| 2010/0060529 | A1 | 3/2010 | Schlub et al. | |
| 2010/0073247 | A1 | 3/2010 | Arkko et al. | |
| 2010/0123632 | A1 | 5/2010 | Hill et al. | |
| 2010/0123635 | A1 | 5/2010 | Lopez et al. | |
| 2010/0205622 | A1 * | 8/2010 | Snider et al. | 720/652 |
| 2010/0271283 | A1 | 10/2010 | Sung et al. | |
| 2011/0063779 | A1 | 3/2011 | Ochi et al. | |
| 2011/0241949 | A1 | 10/2011 | Nickel et al. | |
| 2011/0250928 | A1 | 10/2011 | Schlub et al. | |
| 2012/0001806 | A1 | 1/2012 | Hsiung | |
| 2012/0009983 | A1 | 1/2012 | Mow et al. | |
| 2012/0112969 | A1 | 5/2012 | Caballero et al. | |
| 2012/0162033 | A1 | 6/2012 | Togashi | |
| 2012/0198689 | A1 | 8/2012 | Schlub | |
| 2012/0229347 | A1 | 9/2012 | Jin et al. | |
| 2012/0231750 | A1 | 9/2012 | Jin et al. | |
| 2013/0076574 | A1 | 3/2013 | Rappoport et al. | |
| 2013/0081261 | A1 | 4/2013 | Pienkowski | |
| 2013/0170013 | A1 * | 7/2013 | Tonar et al. | 359/296 |
| 2013/0257659 | A1 * | 10/2013 | Darnell et al. | 343/702 |

FOREIGN PATENT DOCUMENTS

| | | |
|---|---|---|
| CN | 2779773 | 5/2006 |
| CN | 1870676 | 11/2006 |
| DE | 20314836 | 11/2003 |
| DE | 10252308 | 4/2004 |
| DE | 10353104 | 6/2005 |
| EP | 0534290 | 3/1993 |
| EP | 1209880 | 5/2002 |
| EP | 1257147 | 11/2002 |
| EP | 1441489 | 7/2004 |
| EP | 1732230 | 12/2006 |
| EP | 1870956 | 12/2007 |
| EP | 2343872 | 7/2011 |
| GB | 2137425 | 10/1984 |
| GB | 2384367 | 7/2003 |
| JP | 2003011194 | 4/2003 |
| JP | 2004213498 | 7/2004 |

(56) References Cited

FOREIGN PATENT DOCUMENTS

| | | |
|---|---|---|
| JP | 2005130156 | 5/2005 |
| KR | 2004108759 | 12/2004 |
| KR | 20070047650 | 5/2007 |
| TW | 439327 B | 6/2001 |
| WO | 0148861 | 7/2001 |
| WO | 2008010149 | 1/2008 |
| WO | 2008032086 | 3/2008 |
| WO | 2008152438 | 12/2008 |
| WO | 2009056143 | 5/2009 |
| WO | 2010123733 | 10/2010 |

OTHER PUBLICATIONS

Shedletsky et al., U.S. Appl. No. 61/377,866, filed Aug. 27, 2010.

Lee et al. “A Compact and Low-Profile Tunable Loop Antenna Integrated With Inductors”, IEEE Antennas and Wireless Propagation Letters, vol. 7, 2008 pp. 621-624.

Menzel et al., “A Microstrip Patch Antenna with Coplanar Feed Line” IEEE Microwave and Guided Wave Letters, vol. 1, No. 11, Nov. 1991, pp. 340-342.

Terada et al., “Circularly Polarized Tunable Microstrip Patch Antenna Using an Adjustable Air Gap”, Proceedings of ISAP2005, Seoul, Korea pp. 977-980.

* cited by examiner

CUSTOMIZABLE ANTENNA FEED STRUCTURE

BACKGROUND

This relates generally to electronic devices, and more particularly, to electronic devices that have antennas.

Electronic devices such as computers and handheld electronic devices are often provided with wireless communications capabilities. For example, electronic devices may use long-range wireless communications circuitry such as cellular telephone circuitry to communicate using cellular telephone bands. Electronic devices may use short-range wireless communications links to handle communications with nearby equipment. For example, electronic devices may communicate using the WiFi® (IEEE 802.11) bands at 2.4 GHz and 5 GHz and the Bluetooth° band at 2.4 GHz.

Antenna performance can be critical to proper device operation. Antennas that are inefficient or that are not tuned properly may result in dropped calls, low data rates, and other performance issues. There are limits, however, to how accurately conventional antenna structures can be manufactured.

Many manufacturing variations are difficult or impossible to avoid. For example, variations may arise in the size and shape of printed circuit board traces, variations may arise in the density and dielectric constant associated with printed circuit board substrates and plastic parts, and conductive structures such as metal housing parts and other metal pieces may be difficult or impossible to construct with completely repeatable dimensions. Some parts are too expensive to manufacture with precise tolerances and other parts may need to be obtained from multiple vendors, each of which may use a different manufacturing process to produce its parts.

Manufacturing variations such as these may result in undesirable variations in antenna performance. An antenna may, for example, exhibit an antenna resonance peak at a first frequency when assembled from a first set of parts, while exhibiting an antenna resonance peak at a second frequency when assembled from a second set of parts. If the resonance frequency of an antenna is significantly different than the desired resonance frequency for the antenna, a device may need to be scrapped or reworked.

It would therefore be desirable to provide a way in which to address manufacturability issues such as these so as to make antenna designs more amenable to reliable mass production.

SUMMARY

An electronic device may be provided with antennas. An electronic device may have a peripheral conductive housing member that runs along a peripheral edge of the electronic device. The peripheral conductive housing member and other conductive structures may be used in forming an antenna in the electronic device. An antenna feed having positive and ground antenna feed terminals may be used to feed the antenna.

During manufacturing operations, parts for an electronic device may be constructed using different manufacturing processes and may otherwise be subject to manufacturing variations. To compensate for manufacturing variations, custom antenna structures may be included in the antenna of each electronic device. The custom antenna structures may make customized alterations to antenna feed structures or other conductive antenna paths.

The custom antenna structures may be formed from a printed circuit board with a customizable trace. The customizable trace may form a contact pad on the printed circuit board. The customizable trace may be customized so that the pad connects to a desired one of a plurality of contacts associated with the conductive housing member to form a customized antenna feed terminal. The customized antenna feed terminal may, for example, be used to feed the peripheral conductive housing member at a selected location along its length to adjust antenna performance.

Further features of the invention, its nature and various advantages will be more apparent from the accompanying drawings and the following detailed description of the preferred embodiments.

DETAILED DESCRIPTION

Figure 1:
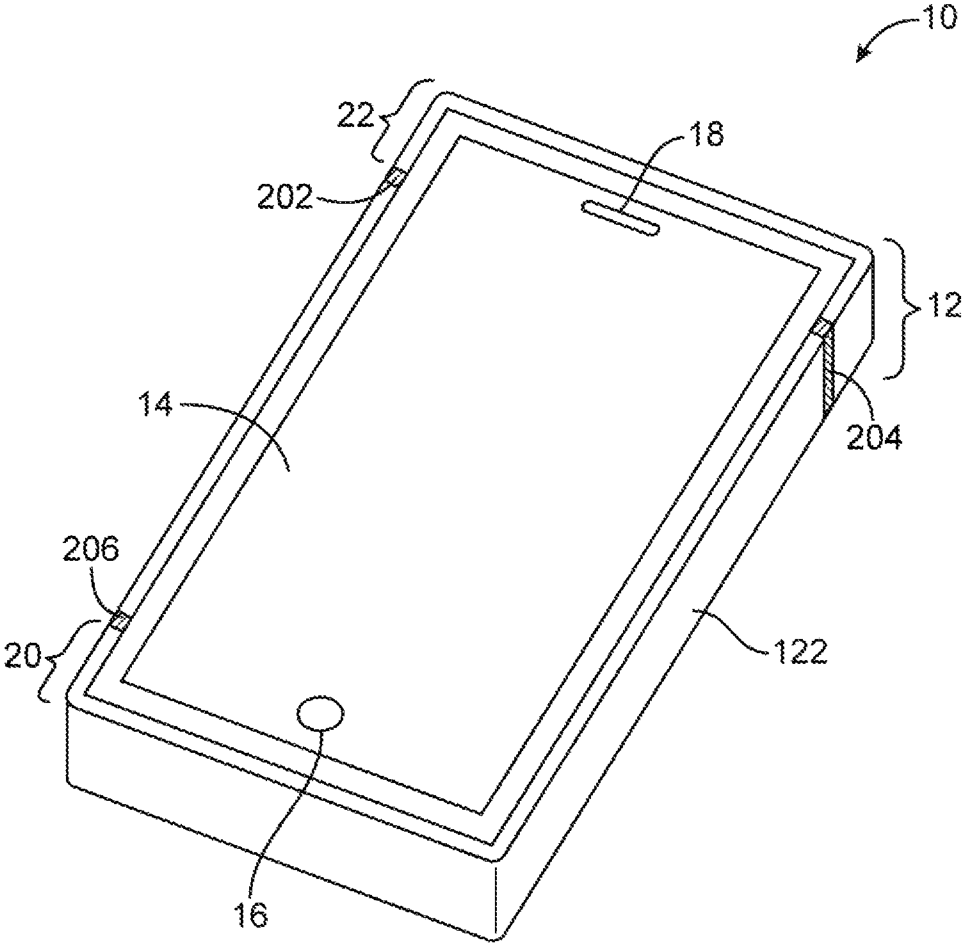
FIG. 1 is a perspective view of an illustrative electronic device with wireless communications circuitry in accordance with an embodiment of the present invention.

An illustrative electronic device of the type that may be provided with custom antenna structures to compensate or manufacturing variations is shown in FIG. 1. Electronic devices such as illustrative electronic device 10 of FIG. 1 may be laptop computers, tablet computers, cellular telephones, media players, other handheld and portable electronic devices, smaller devices such as wrist-watch devices, pendant devices, headphone and earpiece devices, other wearable and miniature devices, or other electronic equipment.

As shown in FIG. 1, device 10 includes housing 12. Housing 12, which is sometimes referred to as a case, may be formed of materials such as plastic, glass, ceramics, carbon-fiber composites and other fiber-based composites, metal, other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Device 10 may, if desired, have a display such as display 14. Display 14 may be a touch screen that incorporates capacitive touch electrodes or other touch sensors or may be touch insensitive. Display 14 may include image pixels formed from light-emitting diodes (LEDs), organic LEDs (OLEDs), plasma cells, electronic ink elements, liquid crystal display (LCD) pixels, or other suitable image pixel structures. A cover layer such as a cover glass member or a transparent planar plastic member may cover the surface of display 14. Buttons such as button 16 may pass through openings in the cover glass. Openings may also be formed in the glass or plastic display cover layer of display 14 to form a speaker port such as speaker port 18. Openings in housing 12 may be used to form input-output ports, microphone ports, speaker ports, button openings, etc.

Housing 12 may include a rear housing structure such as a planar glass member, plastic structures, metal structures, fiber-composite structures, or other structures. Housing 12 may also have sidewall structures. The sidewall structures may be formed from extended portions of the rear housing structure or may be formed from one or more separate members. A bezel or other peripheral member may surround display 14. The bezel may, for example, be formed from a conductive material. With the illustrative configuration shown in FIG. 1, housing 12 includes a peripheral conductive member such as peripheral conductive member 122. Peripheral conductive member 122, which may sometimes be referred to as a band, may have vertical sidewall structures, curved or angled sidewall structures, or other suitable shapes. Peripheral conductive member 122 may be formed from stainless steel or other metals or other conductive materials. In some configurations, peripheral conductive member 122 may have one or more dielectric-filled gaps such as gaps 202, 204, and 206. Gaps such as gaps 202, 204, and 206 may be filled with plastic or other dielectric materials and may be used in dividing peripheral conductive member 122 into segments. The shapes of the segments of conductive member 122 may be chosen to form antennas with desired antenna performance characteristics.

Wireless communications circuitry in device 10 may be used to form remote and local wireless links. One or more antennas may be used during wireless communications. Single band and multiband antennas may be used. For example, a single band antenna may be used to handle local area network communications at 2.4 GHz (as an example). As another example, a multiband antenna may be used to handle cellular telephone communications in multiple cellular telephone bands. Antennas may also be used to receive global positioning system (GPS) signals at 1575 MHz in addition to cellular telephone signals and/or local area network signals. Other types of communications links may also be supported using single-band and multiband antennas.

Antennas may be located at any suitable locations in device 10. For example, one or more antennas may be located in an upper region such as region 22 and one or more antennas may be located in a lower region such as region 20. If desired, antennas may be located along device edges, in the center of a rear planar housing portion, in device corners, etc.

Antennas in device 10 may be used to support any communications bands of interest. For example, device 10 may include antenna structures for supporting local area network communications (e.g., IEEE 802.11 communications at 2.4 GHz and 5 GHz for wireless local area networks), signals at 2.4 GHz such as Bluetooth® signals, voice and data cellular telephone communications (e.g., cellular signals in bands at frequencies such as 700 MHz, 850 MHz, 900 MHz, 1800 MHz, 1900 MHz, 2100 MHz, etc.), global positioning system (GPS) communications at 1575 MHz, signals at 60 GHz (e.g., for short-range links), etc.

Figure 2:
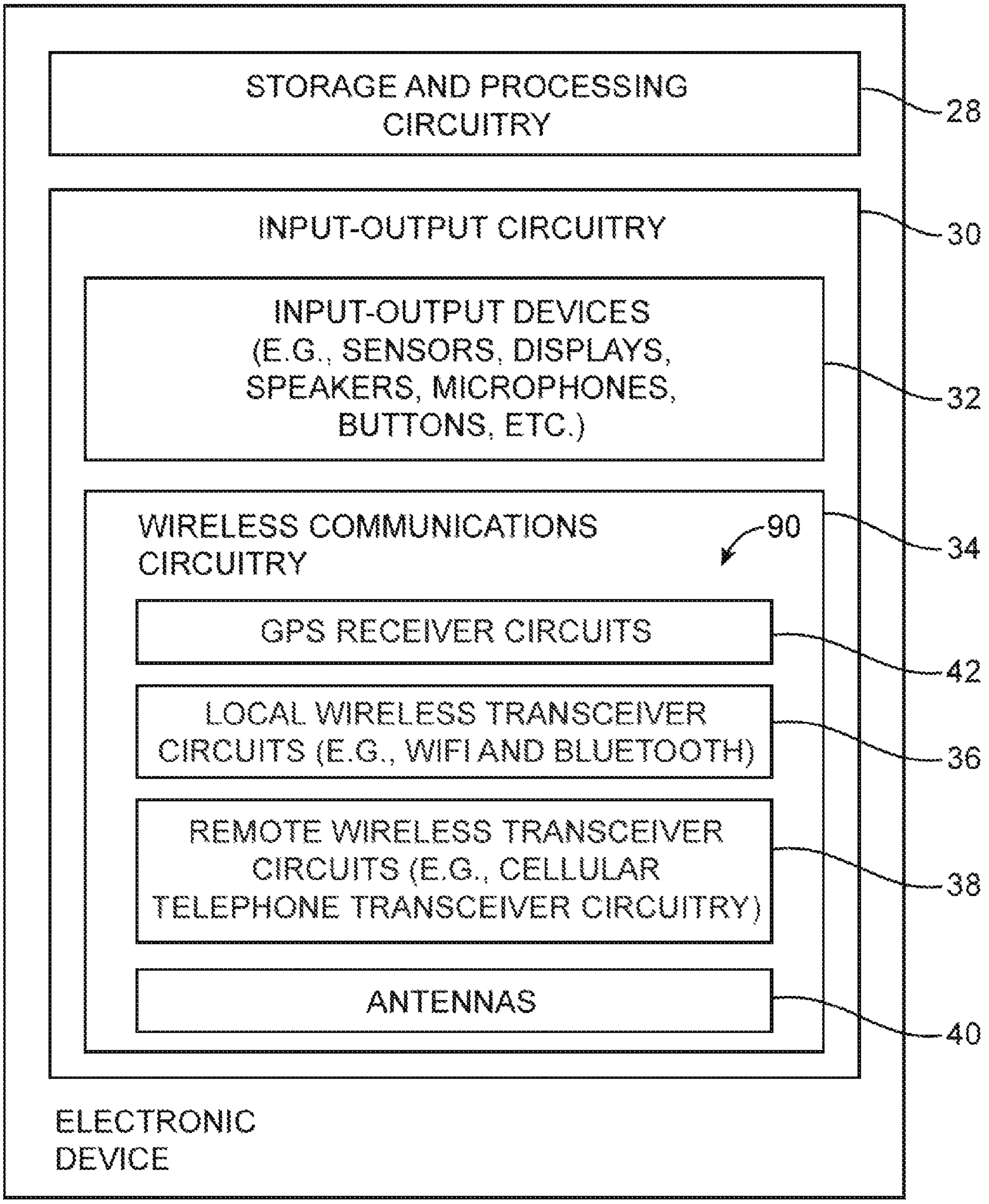
FIG. 2 is a schematic diagram of an illustrative electronic device with wireless communications circuitry in accordance with an embodiment of the present invention.

A schematic diagram showing illustrative components that may be used in device 10 of FIG. 1 is shown in FIG. 2. As shown in FIG. 2, device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands at 700 MHz, 850 MHz, 900 MHz, 1800 MHz, 1900 MHz, and 2100 MHz (as examples). Circuitry 38 may handle voice data and non-voice data. Wireless communications circuitry 34 can include circuitry for other short-range and long-range wireless links if desired. For example, wireless communications circuitry 34 may include 60 GHz transceiver circuitry, circuitry for receiving television and radio signals, paging system transceivers, etc. Wireless communications circuitry 34 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include one or more antennas 40. Antennas 40 may be formed using any suitable antenna types. For example, antennas 40 may include antennas with resonating elements that are formed from loop antenna structure, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

Figure 3:
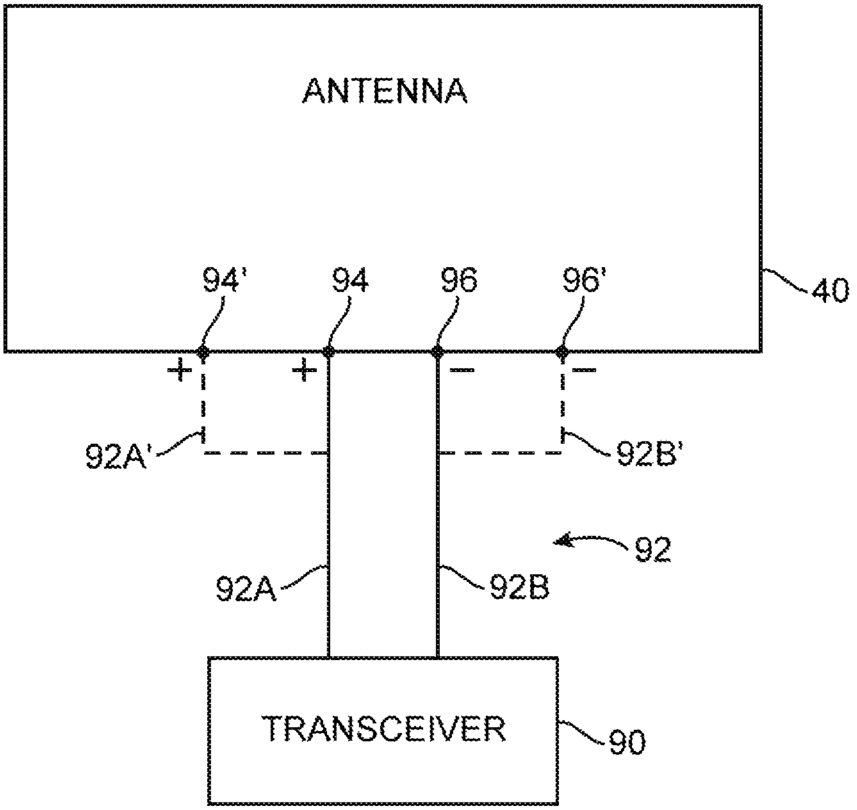
FIG. 3 is circuit diagram of illustrative wireless communications circuitry having a radio-frequency transceiver coupled to an antenna by a transmission line in accordance with an embodiment of the present invention.

As shown in FIG. 3, transceiver circuitry 90 may be coupled to one or more antennas such as antenna 40 using transmission line structures such as antenna transmission line 92. Transmission line 92 may have positive signal path 92A and ground signal path 92B. Paths 92A and 92B may be formed on rigid and flexible printed circuit boards, may be formed on dielectric support structures such as plastic, glass, and ceramic members, may be formed as part of a cable, etc. Transmission line 92 may be formed using one or more microstrip transmission lines, stripline transmission lines, edge coupled microstrip transmission lines, edge coupled stripline transmission lines, coaxial cables, or other suitable transmission line structures.

Transmission line 92 may be coupled to an antenna feed formed from antenna feed terminals such as positive antenna feed terminal 94 and ground antenna feed terminal 96. As shown in FIG. 3, changes may be made to the conductive pathways that are used in feeding antenna 40. For example, conductive structures in device 10 may be customized to change path 92A to a configuration of the type illustrated by path 92A' to couple transmission line 92 to positive antenna feed terminal 94' rather than positive antenna feed terminal 94 (i.e., to adjust the location of the positive antenna feed terminal). Conductive structures may also be customized to so that path 92B is altered to follow path 92B' to couple to ground antenna feed terminal 96' rather than ground antenna feed terminal 96 (i.e., to adjust the location of the ground antenna feed terminal). If desired, a matching circuit or other radio-frequency front end circuitry (e.g., switches, filters, etc.) may be interposed in the radio-frequency signal path between transceiver 90. For example, an impedance matching circuit may be interposed between transmission line 92 and antenna 40. In this type of configuration, the changes that are made to the antenna feed may be made to the conductive structures that are interposed between the matching circuit and antenna 40 (as an example).

Conductive structure changes such as the illustrative changes associated with paths 92A' and 92B' of FIG. 3 (e.g., changes to the positions of the positive and/or ground antenna feed terminals among the structures of the antenna) affect antenna performance. In particular, the frequency response of the antenna (characterized, as an example, by a standing wave ratio plot as a function of operating frequency) will exhibit changes at various operating frequencies. In some situations, the antenna will become more responsive at a given frequency and less responsive at another frequency. Feed alterations may also create global antenna efficiency increases or global antenna efficiency decreases.

Figure 4:
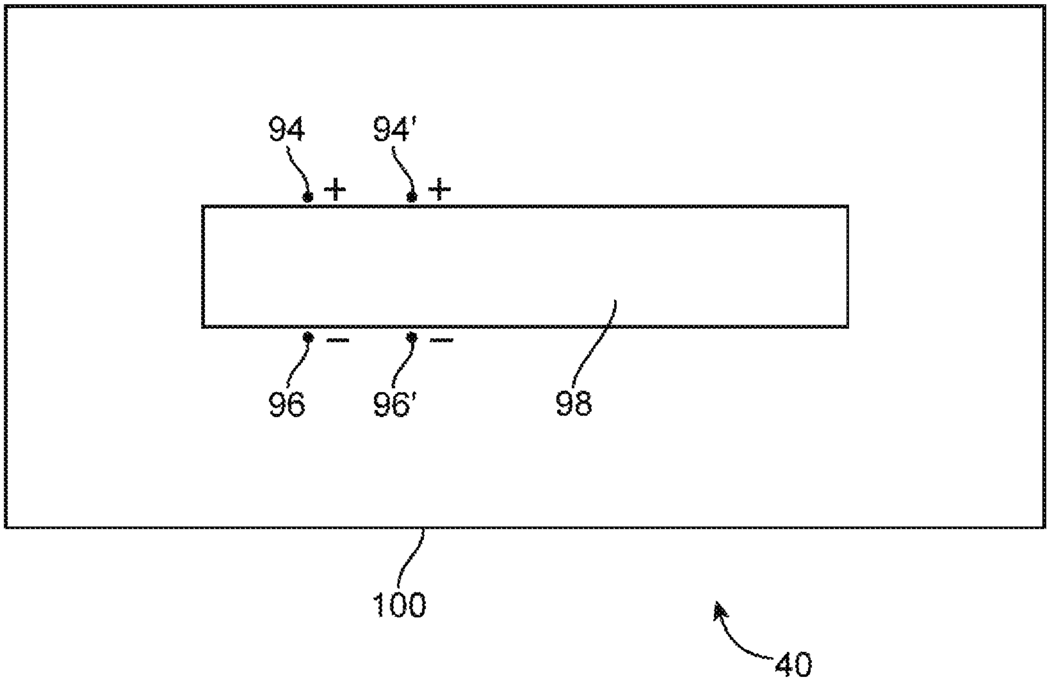
FIG. 4 is a top view of a slot antenna showing how the position of antenna feed terminals may be varied to adjust antenna performance and thereby compensate for manufacturing variations in accordance with an embodiment of the present invention.

A diagram showing illustrative feed positions that may be used in a slot antenna in device 10 is shown in FIG. 4. As shown in FIG. 4, slot antenna 40 may be formed from conductive structures 100 that form slot 98. Slot 98 may be formed from a closed or open rectangular opening in structures 100 or may have other opening shapes. Slot 98 is generally devoid of conductive materials. In a typical arrangement, some or all of slot 98 may be filled with air and some or all of slot 98 may be filled with other dielectric materials (e.g., electronic components that are mostly formed from plastic, plastic support structures, printed circuit board substrates such as fiberglass-filled epoxy substrates, flex circuits formed from sheets of polymer such as polyimide, etc.).

In antennas such as slot antenna 40 of FIG. 4, the position of the antenna feed tends to affect antenna performance. For example, antenna 40 of FIG. 4 will typically exhibit a different frequency response when fed using an antenna feed formed from positive antenna feed terminal 94 and ground antenna feed terminal 96 than when fed using positive antenna feed terminal 94' and ground antenna feed terminal 96'. In this example, both the positive and ground feed terminal positions were changed simultaneously, but movement of the positive feed terminal position without adjusting the ground feed terminal (or movement of the ground terminal without adjusting the positive terminal) will generally likewise affect antenna performance.

Figure 5:
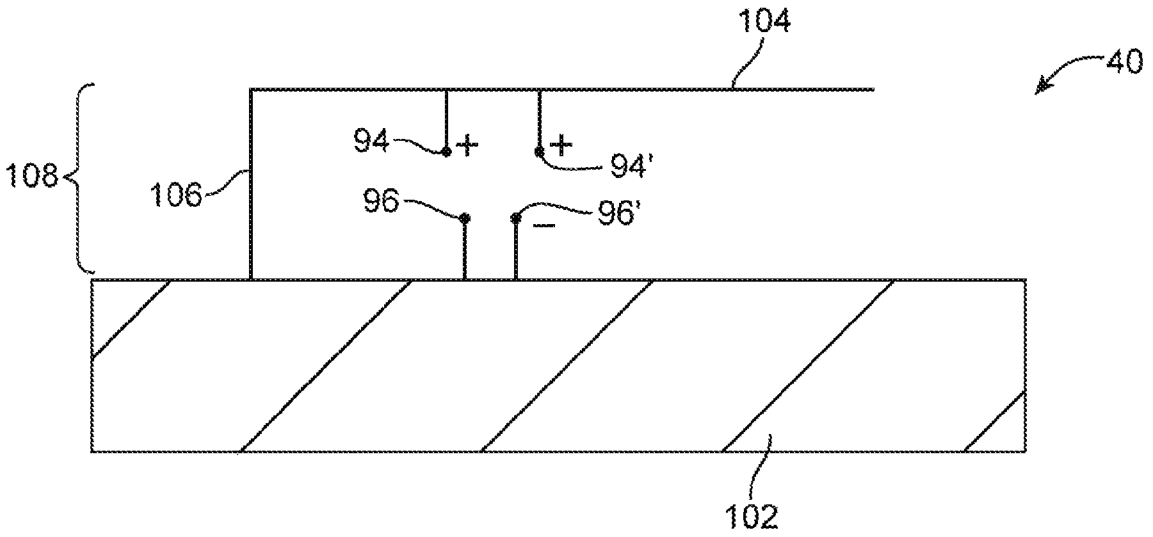
FIG. 5 is a diagram of an inverted-F antenna showing how the position of antenna feed terminals may be varied to adjust antenna performance and thereby compensate for manufacturing variations in accordance with an embodiment of the present invention.

FIG. 5 is a diagram showing illustrative feed positions that may be used in an inverted-F antenna in device 10. As shown in FIG. 5, inverted-F antenna 40 may be formed from antenna ground 102 and antenna resonating element 108. Antenna ground 102 and antenna resonating element 108 may be formed from one or more conductive structures in device 10 (e.g., conductive housing structures, printed circuit board traces, wires, strips of metal, etc.). Antenna resonating element 108 may have a main arm such as antenna resonating element arm 104. Short circuit branch 106 may be used to create a short circuit path between arm 104 and ground 102.

The position of the antenna feed within antenna 40 of FIG. 5 will generally affect antenna performance. In particular, movements of the antenna feed to different positions along arm 104 will result in different antenna impedances and therefore different frequency responses for the antenna. For example, antenna 40 will typically exhibit a different frequency response when fed using antenna feed terminals 94 and 96 rather than antenna feed terminals 94' and 96' and will typically exhibit a different frequency response if terminal 94 is moved to the position of terminal 94' without moving terminal 96 or if terminal 96 is moved to the position of terminal 96' without moving terminal 94.

The configuration of the conductive structures in antenna 40 such as antenna resonating element structures (e.g., the structures of antenna resonating element 108 of FIG. 5) and antenna ground structures (e.g., antenna ground conductor structures 102 of FIG. 5) also affects antenna performance. For example, changes to the length of antenna resonating element arm 104 of FIG. 5, changes to the position of short circuit branch 106 of FIG. 5, changes to the size and shape of ground 102 of FIG. 5, and changes to the slot antenna structures of FIG. 4 will affect the frequency response of the antenna.

Figure 6:
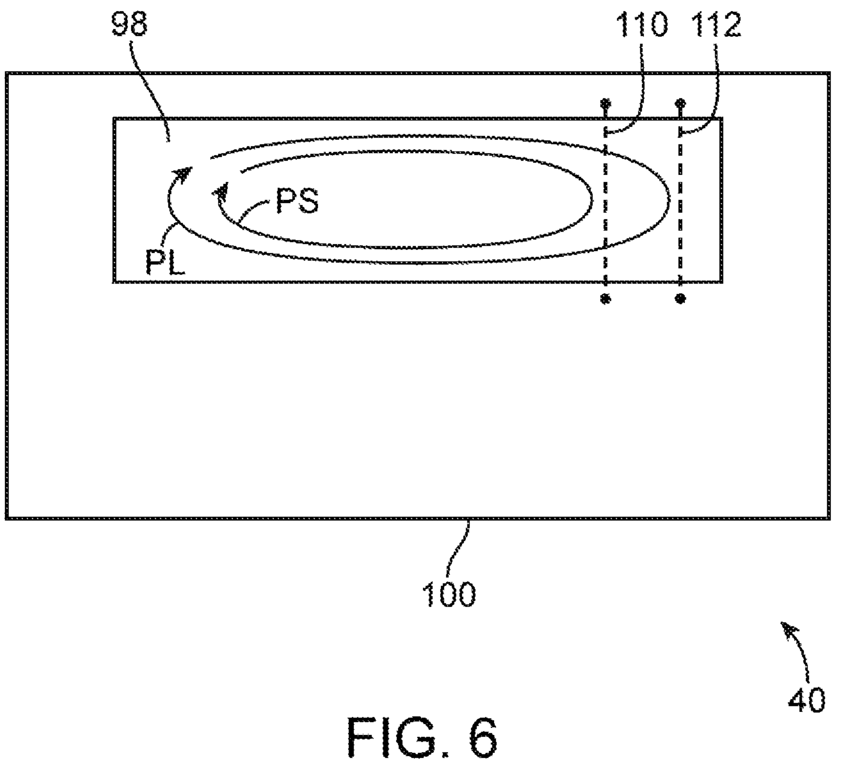
FIG. 6 is a top view of a slot antenna showing how the position of conductive antenna structures in the slot antenna can be varied to adjust slot size and thereby adjust antenna performance to compensate for manufacturing variations in accordance with an embodiment of the present invention.

FIG. 6 illustrates how a slot antenna may be affected by the configuration of conductive elements that overlap the slot. As shown in FIG. 6, slot antenna 40 of FIG. 6 has a slot opening 98 in conductive structure 100. Two illustrative configurations are illustrated in FIG. 6. In the first configuration, conductive element 110 bridges the end of slot 98. In the second configuration, conductive element 112 bridges the end of slot 98.

The length of the perimeter of opening 98 affects the position of the resonance peaks of antenna 100 (e.g., there is typically a resonance peak when radio-frequency signals have a wavelength equal to the length of the perimeter). When element 112 is present in slot 98, the size of the slot is somewhat truncated and exhibits long perimeter PL. When element 110 is present across slot 98, the size of the slot is further truncated and exhibits short perimeter PS. Because PS is shorter than PL, antenna 40 will tend to exhibit a resonance with a higher frequency when structure 110 is present than when structure 112 is present.

Figure 7:
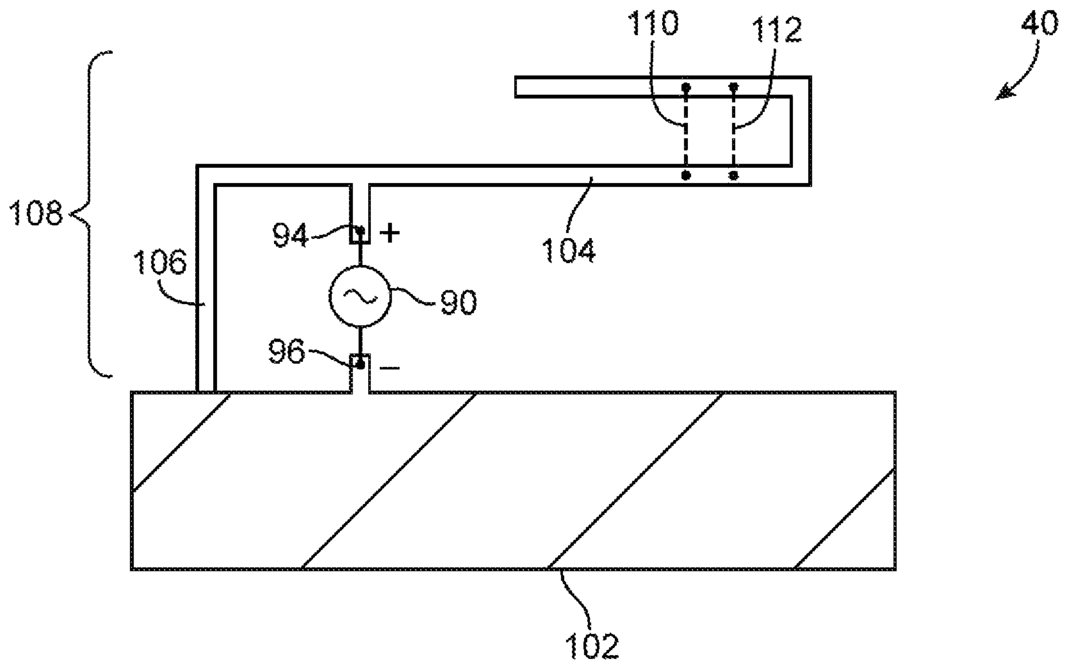
FIG. 7 is a diagram of an inverted-F antenna showing how the position of conductive antenna structures in the inverted-F antenna can be varied to adjust the size of an antenna resonating element structure and thereby adjust antenna performance to compensate for manufacturing variations in accordance with an embodiment of the present invention.

The size and shape of the conductive structures in other types of antennas such as inverted-F antenna 30 of FIG. 7 affect the performance of those antennas. As shown in FIG. 7, antenna resonating element arm 104 in antenna resonating element 108 of antenna 40 may be have a conductive structure that can be placed in the position of conductive structure 110 or the position of conductive structure 112. The position of this conductive structure alters the effective length of antenna resonating element arm 104 and thereby alters the position of the antenna's resonant peaks.

As the examples of FIGS. 3-7 demonstrate, alterations to the positions of antenna feed terminals and the conductive structures that form other portions of an antenna change the performance (e.g., the frequency response) of the antenna. Due to manufacturing variations, antenna feed positions and conductive antenna material shapes and sizes may be inadvertently altered, leading to variations in an antenna's frequency response relative to a desired nominal frequency response. These unavoidable manufacturing variations may arise due to the limits of manufacturing tolerances (e.g., the limited ability to machine metal parts within certain tolerances, the limited ability to manufacture printed circuit board traces with desired conductivities and line widths, trace thickness, etc.). To compensate for undesired manufacturing variations such as these, device 10 may include custom antenna structures.

In a typical manufacturing process, different batches of electronic device 10 (e.g., batches of device 10 formed form parts from different vendors or parts made from different manufacturing processes) can be individually characterized. Once the antenna performance for a given batch of devices has been ascertained, any needed compensating adjustments can be made by forming customized antenna structures such as customized conductive structures associated with an antenna feed and installing the customized antenna structures within the antenna portion of each device.

As an example, a first custom structure may be formed with a first layout to ensure that the performance of a first batch of electronic devices is performing as expected, whereas a second custom structure may be provided with a second layout to ensure that the performance of a second batch of electronic devices is performing as expected. With this type of arrangement, the antenna performances for the first and second batches of devices can be adjusted during manufacturing by virtue of inclusion of the custom structures, so that identical or nearly identical performance between the first and second batches of devices is obtained.

Figure 8:
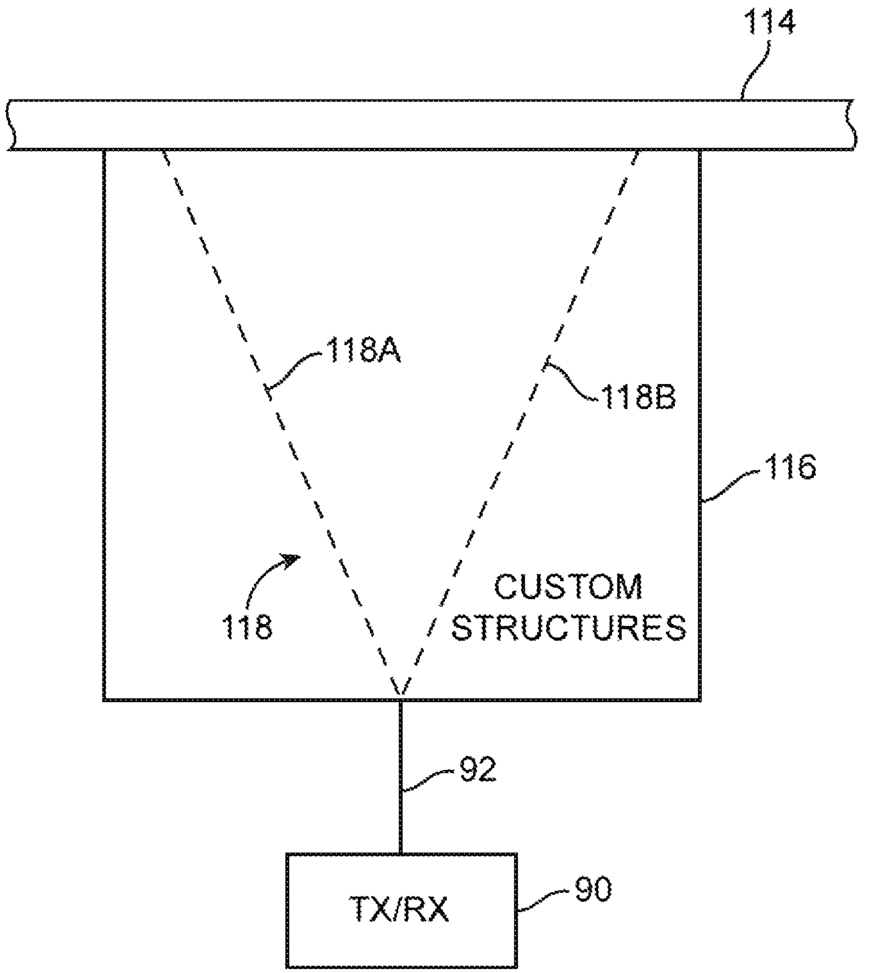
FIG. 8 is a diagram of antenna structures in an electronic device showing how customized antenna feed structures may be used to adjust an antenna to compensate for manufacturing variations in accordance with an embodiment of the present invention.

FIG. 8 shows how antenna 40 may include conductive structures such as conductive structures 114 and custom structures such as custom structures 116. Conductive structures 114 may be antenna resonating element structures, antenna ground structures, etc. With one suitable arrangement, conductive structures 114 may be conductive housing structures (e.g., conductive portions of housing 12 such as peripheral conductive housing member 122 of FIG. 1). Custom structures 116 may be interposed between transmission line 92 and conductive structures 114. Transceiver circuitry 90 may be coupled to transmission line 92.

As shown in FIG. 8, custom structures 116 may include signal paths such as signal path 118. Signal path 118 may include positive and ground structures (e.g., to form transmission structures) or may contain only a single signal line (e.g., to couple part of a transmission line to an antenna structure, to couple respective antenna structures together such as two parts of an antenna resonating element, to connect two parts of a ground plane, etc.). If desired, radio-frequency front-end circuitry such as switching circuitry, filters, and impedance matching circuitry (not shown in FIG. 8) may be coupled between transceiver 90 and conductive structures 114 and other conductive structures associated with antenna 40.

Signal path 118 may be customized during manufacturing operations. For example, custom structures 116 may be manufactured so that a conductive line or other path takes the route illustrated by path 118A of FIG. 8 or may be manufactured so that a conductive line or other path takes the route illustrated by path 118B of FIG. 8. Some electronic devices may receive custom structures 116 in which path 118 has been configured to follow route 118A, whereas other electronic devices may receive custom structures 116 in which path 118 has been configured to follow route 118B. By providing different electronic devices (each of which includes an antenna of the same nominal design) with appropriate customized antenna structures, performance variations can be compensated and performance across devices can be equalized.

The custom antenna structures may be formed from fixed (non-adjustable) structures that are amenable to mass production. Custom structures 116 may, for example, be implemented using springs, clips, wires, brackets, machined metal parts, conductive traces such as metal traces formed on dielectric substrates such as plastic members, printed circuit board substrates, layers of polymer such as polyimide flex circuit sheets, combinations of these conductive structures, conductive elastomeric materials, spring-loaded pins, screws, interlocking metal engagement structures, other conductive structures, or any combination of these structures. Custom structures 116 may be mass produced in a fixed configuration (once an appropriate configuration for custom structures 116 been determined) and the mass produced custom structures may be included in large batches of devices 10 as part of a production line manufacturing process (e.g. a process involving the manufacture of thousands or millions of units).

Figure 9:
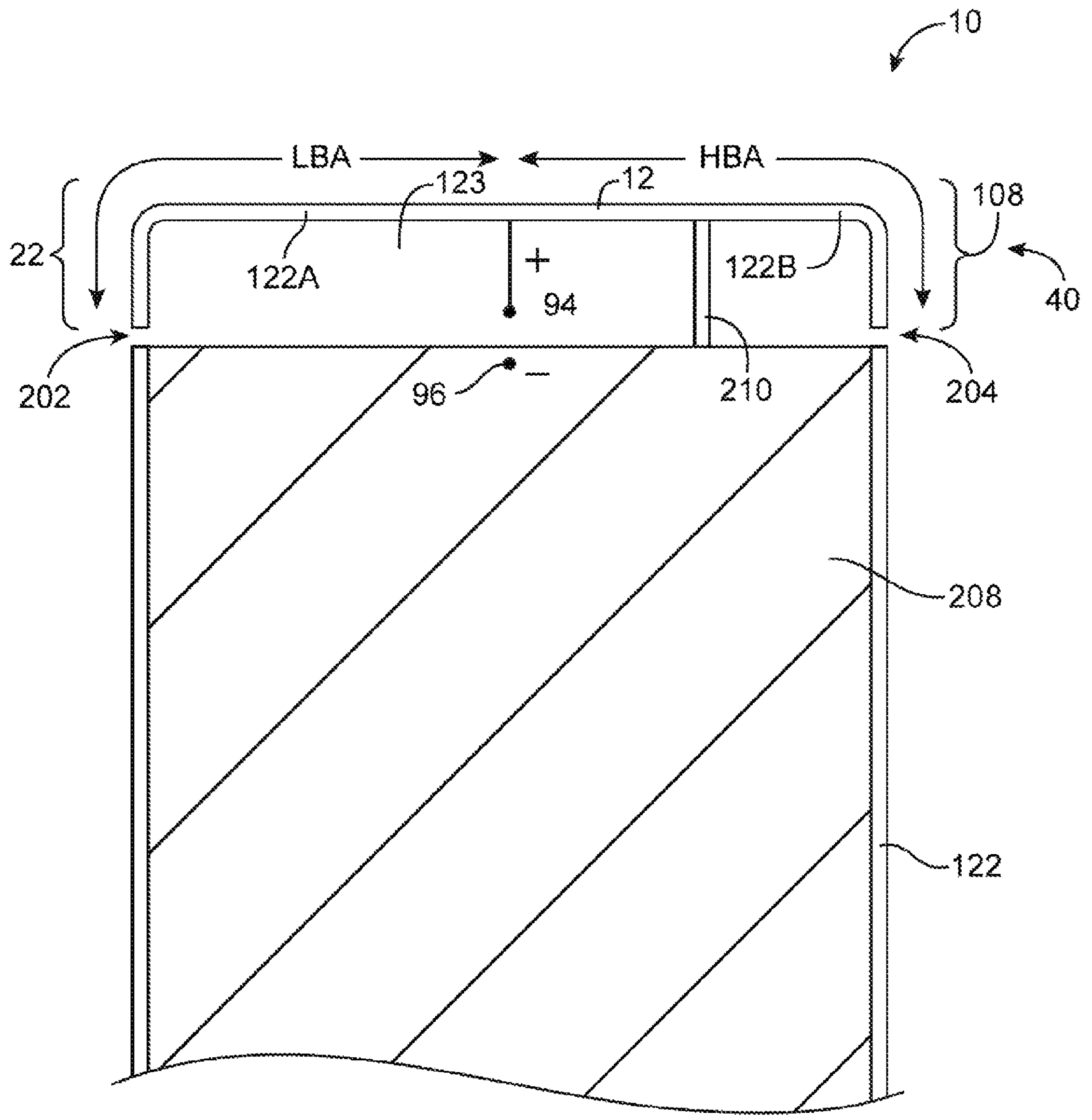
FIG. 9 is a top interior view of an illustrative electronic device of the type that may be provided with custom antenna structures to adjust antenna performance and thereby compensate for manufacturing variations in accordance with an embodiment of the present invention.

An illustrative configuration that may be used for an antenna in device 10 is shown in FIG. 9. As shown in FIG. 9, antenna 40 in region 22 of device 10 may be formed from a ground plane such as ground plane 208 and antenna resonating element 108. Ground plane 208 may be formed from conductive structures in the interior of device 10 such as patterned sheet metal structures over which plastic structures have been molded. Ground plane 208 may also include other conductive structures such as radio-frequency shielding cans, integrated circuits, conductive ground plane structures in printed circuit board, and other electrical components. Antenna resonating element 108 may be formed from a segment of peripheral conductive housing member 122 that extends between gap 202 and gap 204 (as an example). This segment of peripheral conductive housing member 122 may serve as conductive structure 114 of FIG. 8 and may form inverted-F antenna resonating element arm structures such as arm 104 of FIG. 7. Ground plane 208 may serve as ground 102 of FIG. 7. Dielectric-filled gap 123 may be interposed between member 122 and ground pane 208. Gap 123 may be filled with air, plastic, and other dielectric.

Conductive structure 210 may form a short circuit branch for antenna 40 that extends between segment 122B of peripheral conductive housing member 122 and ground plane 208. An antenna feed formed from positive antenna feed terminal 94 and ground antenna feed terminal 96 may be used in feeding antenna 40. Portion 122A of peripheral conductive housing member 122 may form a low-band inverted-F antenna resonating element structure in resonating element 108 and portion 122B of peripheral conductive housing member 122 may form a high-band inverted-F antenna resonating element structure in resonating element 108 (as an example). The relatively longer length LBA of portion 122A may help portion 122A in antenna resonating element 108 give rise to an antenna resonance peak covering one or more low antenna frequency bands, whereas the relatively shorter length HBA of portion 122B may help portion 122B in antenna resonating element 108 give rise to an antenna resonance peak covering one or more high antenna frequency bands. Configurations for antenna 40 that have different types of antenna resonating element (e.g., loop antenna resonating element structures, planar inverted-F structure, dipoles, monopoles, etc.) may be used if desired. The example of FIG. 9 is merely illustrative.

Figure 10:
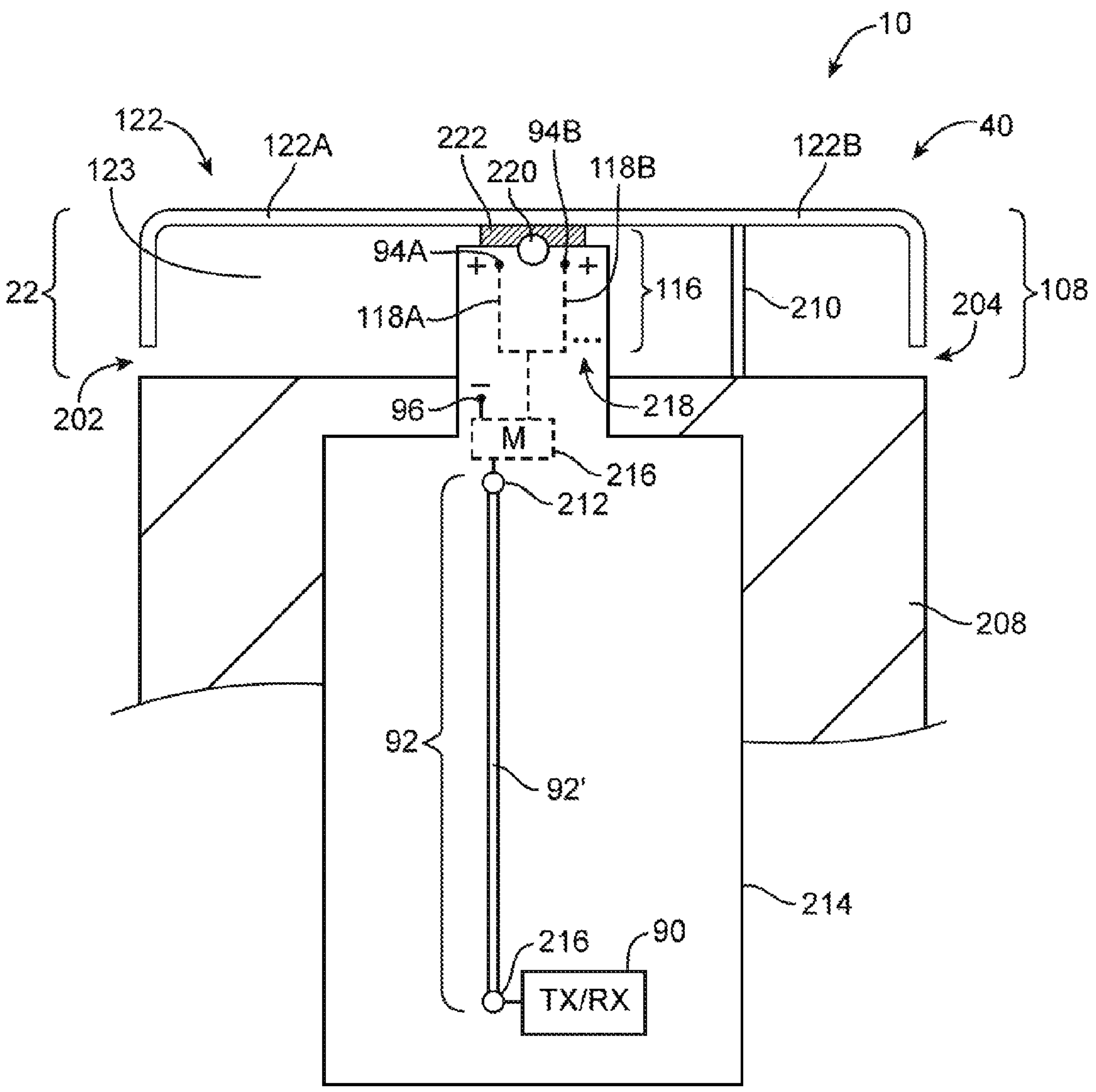
FIG. 10 is a top view of an a portion of an electronic device having an antenna structure that is formed from a peripheral conductive housing member and customized antenna feed structures to adjust antenna performance to compensate for manufacturing variations in accordance with an embodiment of the present invention.

FIG. 10 is a top view of a portion of device 10 showing how custom structures associated with the antenna feed for antenna 40 may be used to adjust the performance (e.g., the frequency response) of antenna 40. As shown in FIG. 10, radio-frequency transceiver circuitry 90 may be mounted on substrate 214. Substrate 214 may be a plastic carrier, a printed circuit formed from a flexible sheet of polymer (e.g., a flex circuit formed form a layer of polyimide with patterned conductive traces), a rigid printed circuit board (e.g., a printed circuit board formed from fiberglass-filled epoxy), or other dielectric. Transmission line 92 may be used to couple radio-frequency transceiver circuitry 90 to antenna 40.

With one suitable arrangement, transmission line 92 may include a coaxial cable such as coaxial cable 92' that is attached to traces on printed circuit board 214 using radio-frequency connectors 212 and 216. Traces on printed circuit board 214 may be used to couple transceiver 90 to connector 216. Traces on printed circuit board 214 may also be used to couple the positive and ground conductors in connector 212 to respective ground and signal traces on printed circuit board 214 adjacent to antenna 40. The ground conductor may be coupled to ground antenna terminal 96 and ground plane 208. The positive conductor may be coupled to peripheral conductive member 122 using custom structures 116.

If desired, radio-frequency front-end circuitry 216 such as switching circuitry, radio-frequency filter circuitry, and impedance matching circuitry may be interposed between transmission line 92 and antenna 40 (e.g., between connector 212 and custom structures 116).

Custom antenna structures 116 may be formed from customizable printed circuit board traces such as optional trace 118A, which forms a first potential signal path that can be used to couple the positive signal line in transmission line 92 to peripheral conductive member 122 in antenna resonating element 108 at positive antenna feed 94A and optional trace 118B, which forms a second potential signal path that can be used to couple the positive signal line in transmission line 92 to peripheral conductive member 122 in antenna resonating element 108 at positive antenna feed 94B.

A conductive structure (e.g., a metal structure) such as bracket 222 may be used in coupling antenna feed terminal 94A and antenna feed terminal 94B to peripheral conductive member 122. Bracket 222 may include a threaded recess that receives screw 220. Screw 220 or other suitable fastening mechanism may be used to secure printed circuit board 214 in customized antenna structures 116 to bracket 222.

As shown by dots 218, customizable structures 116 (e.g., board 214) may contain additional optional paths (i.e., optional traces on board 214 that are located in positions other than the positions indicated by dashed lines 118A and 118B). The use of two optional paths such as paths 118A and 118B in FIG. 10 is merely illustrative.

Following characterization of conductive antenna structures associated with antenna 40, customization structures 116 may be formed using an appropriate pattern of conductive traces. For example, a trace may be formed to create path 118A without forming a trace for path 118B, a trace may be created to form path 118B without forming a trace for path 118A, traces may be fabricated on printed circuit board 214 for both paths 118A and 118B, or other patterns of custom traces may be formed on printed circuit board 214 (or other substrate).

As described in connection with FIG. 8, the pattern of conductive traces that is used in routing radio-frequency signals between transmission line 92 and antenna resonating element 108 (e.g., peripheral conductive member 122) and, in particular, the pattern of traces that defines the feed location for antenna 40 can affect the performance of antenna 40 (e.g., the frequency response of antenna 40). If, for example, customization structures 116 (e.g., traces 118A and/or 118B on printed circuit board 214) are patterned with a first pattern that includes trace 118A but not trace 118B, the positive antenna feed terminal for antenna 40 will be located at the position indicated by antenna feed terminal 94A. If customization structures 116 are patterned with a second pattern that includes trace 118B but not trace 118A, the positive antenna feed terminal for antenna 40 will have the location indicated by feed terminal 94B. When both traces 118A and 118B are present on customization structures 116, antenna 40 may be considered to have a positive antenna feed terminal that is distributed across peripheral conductive member 122 from the position of terminal 94A to terminal 94B.

Figure 11:
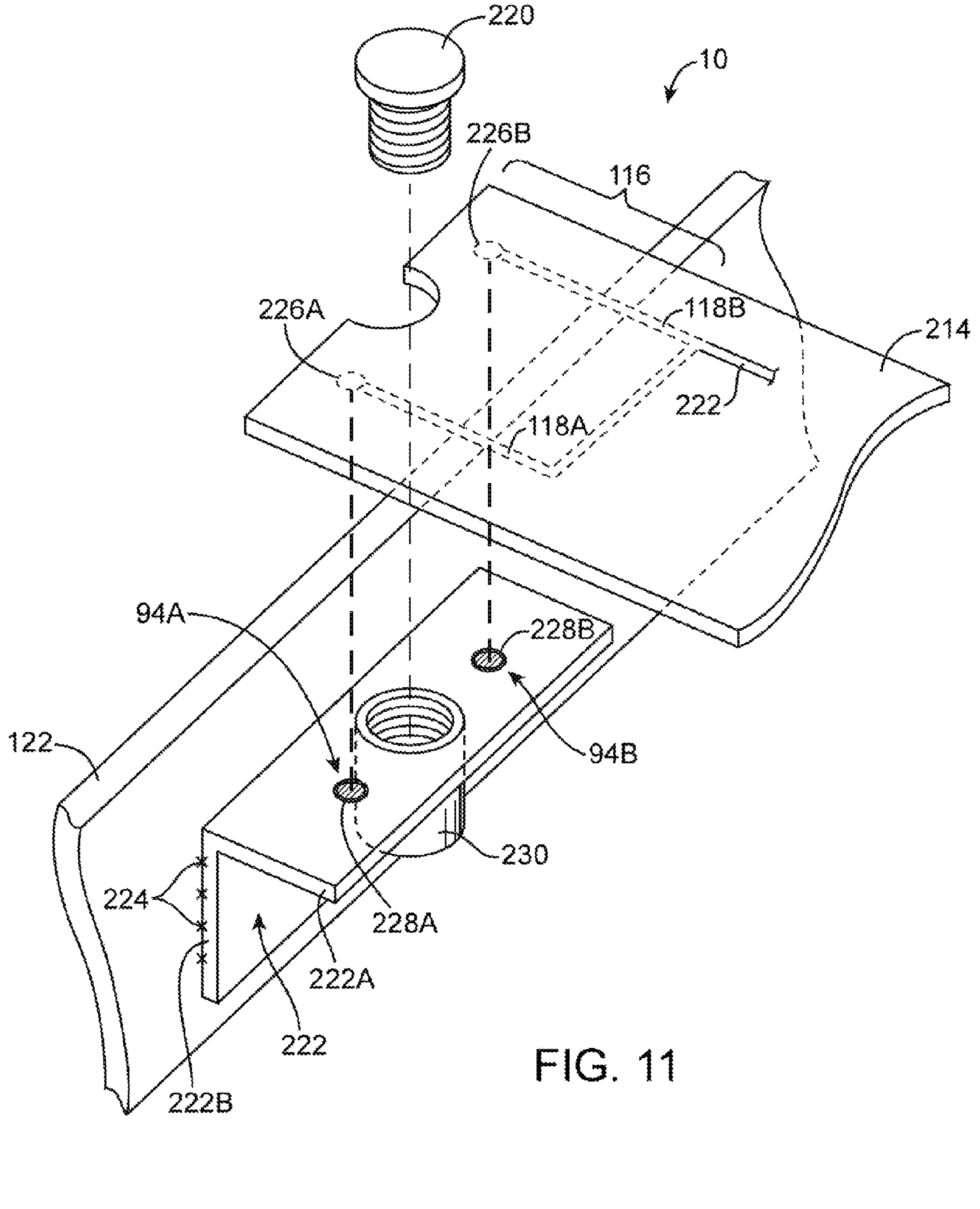
FIG. 11 is a perspective view of an illustrative custom antenna structure based on printed circuit board that has customizable traces and based on a bracket with corresponding antenna feed contacts at different positions to adjust antenna performance to compensate for manufacturing variations in accordance with an embodiment of the present invention.

FIG. 11 is an exploded perspective view of a portion of device 10 in the vicinity of antenna feed terminals 94A and 94B. As shown in FIG. 11, bracket 222 may be attached to peripheral conductive housing member 122 using welds 224. If desired, bracket 222 may be electrically and mechanically connected to peripheral conductive housing member 122 using screws or other fasteners, solder, conductive adhesive, or other suitable attachment mechanisms.

Bracket 222 be formed from metal or other conductive materials. Bracket 222 may have a first portion such as portion 22B that extends vertically and is suitable for welding to peripheral conductive housing member 122. Bracket 222 may also have a second portion such as horizontal portion 222A. Horizontal portion 222A may have contact regions (sometimes referred to as contacts, contact pads, or terminals) such as contact region 228A and 228B. Contacts 228A and 222B may be located at suitable locations along the length of peripheral conductive housing member 122 for forming antenna feed terminals 94A and 94B, respectively. Contacts 228A and 228B may be formed from portions of bracket 222. A coating such as a metal paint coating (e.g., gold paint applied using a paint brush, silver paint, metal films deposited by electrochemical deposition or physical vapor deposition, etc.) may be used to help form low-contact-resistance contact structures for contacts 228A and 228B.

Printed circuit board 214 may be used in supporting mating contacts (sometimes referred to as contact pads, contact regions, or terminals). As shown in FIG. 11, for example, contact 226A and/or contact 226B may be formed on the underside of printed circuit board 214. Trace 222 on printed circuit board 214 may form a positive signal line that is coupled to the positive signal conductor in transmission line 92. Contact 226A may be electrically connected to the tip of trace 118A when trace 118A is present and may be used to electrically connect path 222 to contact 228A. Contact 226B may be connected to the tip of trace 118B when trace 118B is present and may be configured to mate with contact 228B.

To install customized antenna structures 116 in device 10, screw 220 may be screwed into screw threads 230 on a portion of bracket 222. This holds printed circuit board 214 and contact regions 226A and 226B against bracket 222 and mating contact regions 228A and 228B. In a given device, customized antenna structures 116 have a particular custom pattern of traces such as trace 118A or trace 118B. Depending on the configuration of customized antenna structures 116, trace 222 will be coupled to contact 228A via path 118A and contact 226A to form an antenna feed at terminal 94A, will be coupled to contact 228B via path 118B and contact 226B to form an antenna feed at terminal, or will be coupled to contacts 228A and 228B simultaneously (when both paths 118A and 118B are implemented in customized antenna structures 116).

Figure 12:
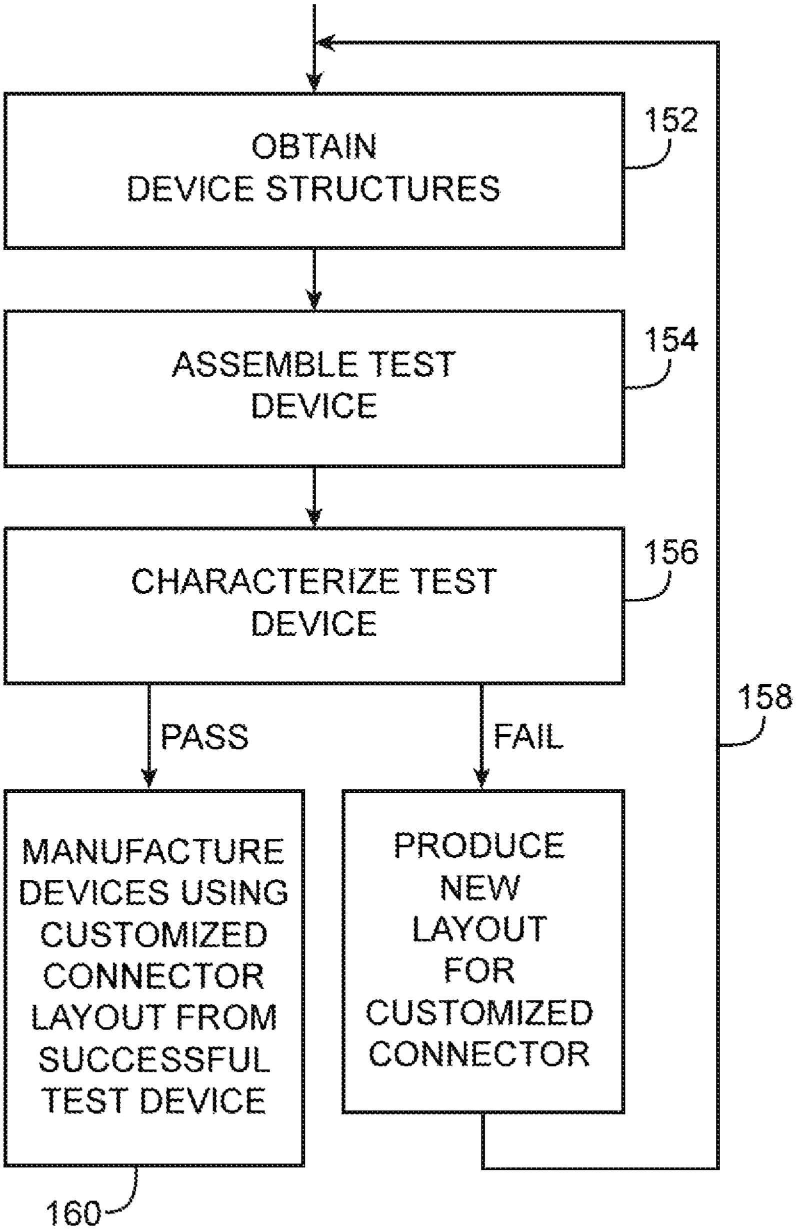
FIG. 12 is a flow chart of illustrative steps involved in characterizing antenna performance in electronic devices formed from a set of components and compensating for manufacturing variations by customizing antenna feed structures in accordance with an embodiment of the present invention.

FIG. 12 is a flow chart of illustrative steps involved in manufacturing devices that include custom antenna structures 116.

At step 152, parts for a particular design of device 10 may be manufactured and collected for assembly. Parts may be manufactured by numerous organizations, each of which may use different manufacturing processes. As a result, there may be manufacturing variations in the parts that can lead to undesirable variations in antenna performance if not corrected.

At step 154, a manufacturer of device 10 may assemble the collected parts to form one or more partial or complete test versions of device 10. A typical manufacturing line may produce thousands or millions of nominally identical units of device 10. Production may take place in numerous batches. Batches may involve thousands of units or more that are assembled from comparable parts (i.e., parts made using identical or similar manufacturing processes). Batch-to-batch variability in antenna performance is therefore typically greater than antenna performance variability within a given batch.

After assembling a desired number of test devices at step 154 (e.g., one or more test devices representative of a batch of comparable devices), the test devices may be characterized at step 156. For example, the frequency response of the antenna in each of the test devices can be measured to determine whether there are frequency response curve shifts and other variations between devices (i.e., between batches).

When assembling test devices at step 154, custom antenna structures 116 or other such structures with a particular configuration (i.e., a particular configuration for path 118) may be used. If test results from the characterization operations of step 156 reveal that antenna performance is deviating from the desired nominal performance (i.e., if there is a frequency shift or other performance variation), appropriate custom antenna structures 116 may be installed in the test devices (i.e., structures with a different trial pattern for conductive path 118). As indicated by line 158, the custom antenna structures 116 and other device structures may be assembled to produce new versions of the test devices (step 154) and may be tested at step 156. If testing reveals that additional modifications are needed, different custom antenna structures 116 (e.g., structures with a different configuration for customized path 118) may again be identified and installed in the test device(s). Once testing at step 156 reveals that the test devices are performing satisfactorily with a given type of customized antenna structures 116, that same type of customized antenna structures 116 (i.e., structures with an identical pattern for conductor 118) may be selected for incorporation into production units.

With this approach, structures 116 with an appropriate custom pattern for line 118 or other custom configuration for the conductive portions of structures 116 may be identified from the test characterization measurements of step 156 and structures 116 with that selected configuration may be installed in numerous production devices during the production line manufacturing operations of step 160. In a typical scenario, once the proper customization needed for structures 116 within a given batch has been identified (i.e., once the proper customized antenna structures for compensating for manufacturing variations have been selected from a plurality of different possible customized antenna structures), all devices 10 within that batch may be manufactured using the same custom antenna structures 116.

Because the custom antenna structures were selected so as to compensate for manufacturing variations, the electronic devices produced at step 160 that include the custom antenna structures will perform as expected (i.e., the antenna frequency response curves for these manufactured devices will be accurate and will be properly compensated by the customized antenna structures for manufacturing variations). As each new batch is assembled, the customization process may be repeated to identify appropriate custom structures 116 for manufacturing that batch of devices. The custom antenna structures may have fixed (non-adjustable) configurations suitable for mass production. If desired, antennas 40 may also be provided with tunable structures (e.g., structures based on field-effect transistor switches and other switches) that may be controlled in real time by storage and processing circuitry 28.

The foregoing is merely illustrative of the principles of this invention and various modifications can be made by those skilled in the art without departing from the scope and spirit of the invention. The foregoing embodiments may be implemented individually or in any combination.

What is claimed is:

1. An electronic device, comprising:

an antenna having a conductive antenna resonating element structure comprising a metal housing structure;

a conductive member that is electrically connected to the conductive antenna resonating element structure, wherein the conductive member comprises a bracket that is welded to the metal housing structure and that has at least first and second contacts at first and second locations along the metal housing structure that serve as first and second positive antenna feed terminals for the antenna;

custom antenna structures that compensate for manufacturing variations that affect antenna performance in the antenna, wherein the custom antenna structures include a printed circuit board with a conductive path connected to the conductive member through only a selected one of the first and second contacts, wherein the conductive path is formed on a surface of the printed circuit board and is coupled to a contact pad on the printed circuit board that connects the conductive path to the selected one of the first and second contacts, and wherein a portion of the printed circuit board overlaps the conductive member such that the surface of the printed circuit board is in direct contact with the conductive member; and a screw that is received by threads in the metal bracket to hold the printed circuit board against the bracket.

2. The electronic device defined in claim 1 further comprising:

a radio-frequency transceiver; and a transmission line that is coupled between the antenna and the radio-frequency transceiver, wherein the transmission line has a positive signal conductor, and wherein the conductive path is configured to couple the positive signal conductor to the conductive member through the selected one of the first and second contacts.

3. The electronic device defined in claim 1 wherein the electronic device has a rectangular periphery and wherein the metal housing structure comprises a peripheral conductive housing member that runs along at least part of the rectangular periphery.

4. The electronic device defined in claim 3 wherein the metal bracket is welded to the peripheral conductive housing member.

5. The electronic device defined in claim 4 wherein the first and second contacts comprise metal paint on the metal bracket.

6. A method for fabricating wireless electronic devices, comprising:

measuring antenna performance in a test device;

based on the measured antenna performance in the test device, fabricating a printed circuit board with a customized trace; and manufacturing a wireless electronic device that includes an antenna having a conductive antenna resonating element structure and a conductive member that is electrically connected to the conductive antenna resonating element structure, wherein the conductive member has at least first and second contacts and wherein manufacturing the wireless electronic device comprises installing the printed circuit board within the wireless electronic device so that the customized trace overlaps and is in direct contact with the first contact without being in contact with the second contact and the second contact is in direct contact with the printed circuit board, and wherein the customized trace serves as an antenna feed terminal for the antenna.

7. The method defined in claim 6 wherein manufacturing the wireless electronic device comprises forming the antenna at least partly from a peripheral conductive housing member that runs along at least part of a peripheral edge in the wireless electronic device.

8. The method defined in claim 7 wherein the conductive member comprises a metal member and wherein manufacturing the wireless electronic device comprises welding the metal member to the peripheral conductive housing member.

9. An antenna, comprising:

a conductive antenna resonating element member comprising a peripheral conductive housing member that runs along at least part of a peripheral edge of an electronic device;

a metal member welded to the peripheral conductive housing member, wherein the metal member has a planar surface and first and second contact regions formed on the planar surface, and wherein the first and second contact regions are associated with respective locations for first and second positive antenna feed terminals for the antenna; and a printed circuit board having an antenna feed signal trace with a contact pad that contacts the first contact region without contacting the second contact region.

10. The antenna defined in claim 9 wherein the conductive antenna resonating element member forms at least part of an inverted-F antenna arm.

11. The antenna defined in claim 9, further comprising a screw, wherein the planar surface has threads interposed between the first and second contact regions, wherein the printed circuit board has an opening that overlaps the threads, and wherein the screw is configured to screw into the threads and hold the printed circuit board in direct contact with the bracket.

12. The electronic device defined in claim 3, wherein the peripheral conductive housing member comprises opposing interior and exterior surfaces, wherein the metal bracket comprises a first surface that is substantially parallel to the interior surface of the peripheral conductive housing member, wherein the metal bracket comprises a second surface that is substantially perpendicular to the first surface of the metal bracket, and wherein the first and second contacts are formed on the second surface of the metal bracket.

* * * * *